(12) United States Patent
Bai et al.

(10) Patent No.: US 11,930,682 B2
(45) Date of Patent: Mar. 12, 2024

(54) DISPLAY PANEL AND DISPLAY DEVICE

(71) Applicant: BOE TECHNOLOGY GROUP CO., LTD., Beijing (CN)

(72) Inventors: Shanshan Bai, Beijing (CN); Yue Liu, Beijing (CN); Yansong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 249 days.

(21) Appl. No.: 17/487,186

(22) Filed: Sep. 28, 2021

(65) Prior Publication Data
US 2022/0254842 A1 Aug. 11, 2022

(30) Foreign Application Priority Data
Feb. 7, 2021 (CN) .......................... 202110168834.3

(51) Int. Cl.
*H01L 27/32* (2006.01)
*H01L 51/56* (2006.01)
(Continued)

(52) U.S. Cl.
CPC .......... *H10K 59/353* (2023.02); *H10K 50/125* (2023.02); *H10K 59/352* (2023.02); *H10K 71/00* (2023.02)

(58) Field of Classification Search
CPC .............................................. H10K 59/35–353
See application file for complete search history.

(56) References Cited

U.S. PATENT DOCUMENTS

2020/0127060 A1* 4/2020 Li .................... H10K 59/353
2020/0403044 A1* 12/2020 Zhao .................... H10K 59/353
2021/0343801 A1* 11/2021 Wang .................... H10K 71/166

FOREIGN PATENT DOCUMENTS

WO WO2019/134515 A1 * 7/2019 ............. C23C 14/12

OTHER PUBLICATIONS

Machine translation, Wang, WIPO Pat. Pub. No. WO2019/134515A1, translation date: Nov. 21, 2023, Clarivate Analytics, all pages. (Year: 2023).*

(Continued)

*Primary Examiner* — Victoria K. Hall
(74) *Attorney, Agent, or Firm* — DINSMORE & SHOHL LLP

(57) ABSTRACT

The present disclosure provides a display panel comprising multiple first, second and third sub-pixels having first, second and third effective light-emitting regions respectively. In a row direction, the first effective light-emitting regions form first rows of effective light-emitting regions, and the second and third effective light-emitting regions are alternately arranged to form second rows of effective light-emitting region. The first and second rows are alternately arranged in a column direction perpendicular to the row direction. A virtual quadrilateral is formed by lines connecting geometric centers of gravity of four first effective light-emitting regions in two adjacent rows and two adjacent columns. Geometric centers of gravity of the second and third effective light-emitting region are located in corresponding virtual quadrilaterals respectively. The second effective light-emitting region comprises at least one first curved edge, and/or the third effective light-emitting region comprises at least one second curved edge.

15 Claims, 8 Drawing Sheets

(51) Int. Cl.
*H10K 50/125* (2023.01)
*H10K 59/35* (2023.01)
*H10K 71/00* (2023.01)

(56) References Cited

OTHER PUBLICATIONS

Machine translation, Claims, Bai, Chinese Pat. Pub. No. CN112992994A, translation date: Nov. 14, 2023, Espacenet, all pages. (Year: 2023).*

* cited by examiner

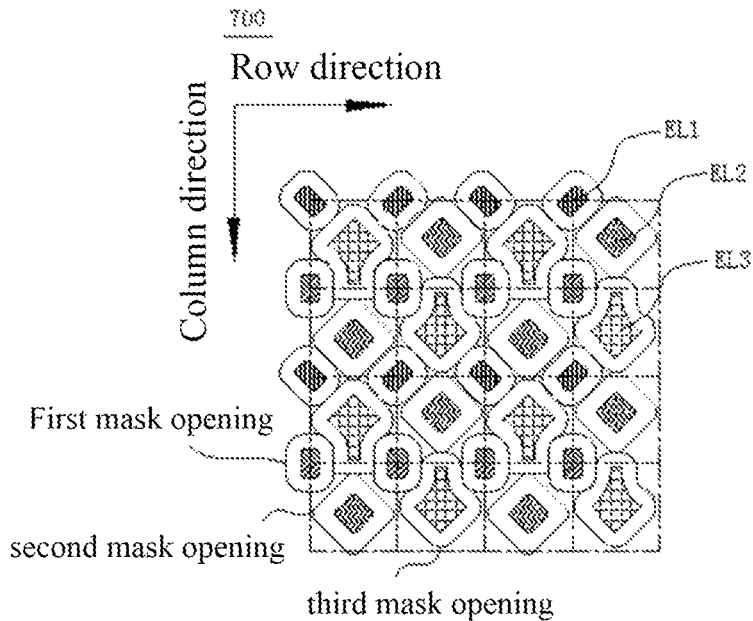

FIG. 15

```
forming a plurality of first effective light-emitting
regions in the row direction, wherein the plurality of
first effective light-emitting regions form a plurality     ───1601
of first rows of effective light-emitting regions
```

```
in a row direction, forming a plurality of second
effective light-emitting regions and a plurality of
third effective light-emitting regions, wherein the         ───1602
plurality of second effective light-emitting regions
and the plurality of third effective light-emitting
regions are alternately arranged
```

FIG. 16

DISPLAY PANEL AND DISPLAY DEVICE

CROSS REFERENCE TO RELATED APPLICATIONS

The present application claims priority to Chinese patent application for invention No. 202110168834.3 filed on Feb. 7, 2021, the disclosure of which is hereby incorporated by reference in its entirety.

FIELD OF THE INVENTION

The present disclosure relates to the field of display technology, and in particular to a display panel and a display device.

BACKGROUND

There are many types of display panels (also known as display screens), such as Organic Light-Emitting Diode (OLED) display panels, Quantum Dot Light-Emitting Diodes (QLED) display panels, etc. As an example, the light-emitting regions of red (R), green (G) and blue (B) sub-pixels in an OLED display panel can be made by vacuum evaporation technology, that is, three different organic light-emitting materials can be evaporated on at corresponding positions using masks to form the light-emitting regions of RGB sub-pixels. This process requires the use of masks with fine structure and good mechanical stability. However, the present manufacturing process of high-precision masks has limited capability. When manufacturing high-resolution OLED display panels, due to the increase of the number of pixels in unit size, the distance between the light-emitting regions of adjacent sub-pixels becomes smaller, and the narrow distance corresponds to "metal strips" on the mask. In the actual evaporation process, these "metal strips" are easy to be affected by the magnetic flux direction of the magnet plate, resulting in mutual contamination and color mixing between sub-pixels. Therefore, the stability of the mask has to be guaranteed at the expense of resolution, making it difficult to balance resolution and mask stability.

In the prior art, by optimizing the sub-pixel design of RGB sub-pixels, one or more sub-pixels are shared. For example, an R sub-pixel is co-owned by two pixels at the same time. After combination, more pixels can be obtained in a limited active area (AA), thereby increasing the resolution. Moreover, for a given resolution and size of the AA area, since the number of sub-pixels required is reduced, the size of individual sub-pixels is increased compared with a situation in which no sharing is applied, so the difficulty of making the mask is also reduced. Therefore, the above scheme can solve the technical problem of improving the resolution and ensuring the display effect of the OLED display panel while taking into account the production quality of the mask.

However, on this basis, due to the different service lives of organic light-emitting materials used in the light-emitting regions of sub-pixels of different colors, in order to effectively prolong the overall service life of OLED display panel, when making the light-emitting regions, in the RGB sub-pixels, a light-emitting region for which a short-life organic light-emitting material is adopted (such as the light-emitting region of a B sub-pixel) has a larger area than a light-emitting region for which a long-life organic light-emitting material is adopted (such as the light-emitting region of a G sub-pixel), which is conducive to prolonging the life of the B sub-pixel, thereby improving the overall life of the OLED display panel. In the prior art, in the implementation process of adjusting, for example, the area of the light-emitting region of a B sub-pixel, because the light-emitting region of the B sub-pixel may need to occupy the original positions of the light-emitting regions of a R sub-pixel and/or a G sub-pixel, the positions of the light-emitting regions of R and/or G sub-pixels need to be adjusted to make room for the light-emitting region of the B sub-pixel, which increases the complexity of the design.

SUMMARY

According to an aspect of the present disclosure, there is provided a display panel, comprising:
a plurality of first sub-pixels, a plurality of second sub-pixels and a plurality of third sub-pixels; wherein the first sub-pixel comprises a first light-emitting device which comprises a first effective light-emitting region; the second sub-pixel comprises a second light-emitting device which comprises a second effective light-emitting region; and the third sub-pixel comprises a third light-emitting device which comprises a third effective light-emitting region;
in a row direction, the plurality of first effective light-emitting regions form a plurality of first rows of effective light-emitting regions, and the plurality of second effective light-emitting regions and the plurality of third effective light-emitting regions are alternately arranged to form a plurality of second rows of effective light-emitting regions; the first rows of effective light-emitting regions and the second rows of effective light-emitting regions are alternately arranged in a column direction perpendicular to the row direction; a virtual quadrilateral is formed by lines connecting geometric centers of gravity of four first effective light-emitting regions in two adjacent rows and two adjacent columns;
the geometric centers of gravity of the second effective light-emitting region and the geometric centers of gravity of the third effective light-emitting region are located in corresponding virtual quadrilaterals respectively;
the second effective light-emitting region comprises at least one first curved edge, and/or the third effective light-emitting region comprises at least one second curved edge.

In some embodiments of the present disclosure, the first effective light-emitting region comprises a first portion adjacent to the first curved edge, the first portion being in a shape corresponding to a shape of the first curved edge;
and/or
the first effective light-emitting region comprises a second portion adjacent to the second curved edge, the second portion being in a shape corresponding to a shape of the second curved edge.

In some embodiments of the present disclosure, the first curved edge is a concave curved edge, and the first portion has a convex shape;
and/or
the second curved edge is a concave curved edge, and the second portion has a convex shape.

In some embodiments of the present disclosure, a portion of the second effective light-emitting region is located between two adjacent first effective light-emitting regions;
and/or a portion of the third effective light-emitting region is located between two adjacent first effective light-emitting regions.

In some embodiments of the present disclosure, the second effective light-emitting region comprises at least two first curved edges and a first straight edge, wherein the two first curved edges are connected with both ends of the first straight edge, and the first straight edge is located between two adjacent first effective light-emitting regions along the row direction or the column direction;

and/or the third effective light-emitting region comprises at least two second curved edges and a second straight edge, wherein the two second curved edges are connected with both ends of the second straight edge, and the second straight edge is located between two adjacent first effective light-emitting regions along the row direction or the column direction.

In some embodiments of the present disclosure, a distance between the first geometric center of gravity and the second geometric center of gravity is not equal to a distance between the first geometric center of gravity and the third geometric center of gravity;

wherein the first geometric center of gravity is the geometric center of gravity of the first effective light-emitting region, the second geometric center of gravity is the geometric center of gravity of the second effective light-emitting region adjacent to the first effective light-emitting region, and the third geometric center of gravity is the geometric center of gravity of the third effective light-emitting region adjacent to the first effective light-emitting region.

In some embodiments of the present disclosure, the second effective light-emitting region has an even number of first curved edges and is an axial symmetric pattern;

and/or the third effective light-emitting region has an even number of second curved edges and is an axial symmetric pattern.

In some embodiments of the present disclosure, in two adjacent second rows of effective light-emitting regions, each second effective light-emitting region has the same shape and size;

and/or in two adjacent second rows of effective light-emitting regions, each third effective light-emitting region has the same shape and size.

In some embodiments of the present disclosure, two second effective light-emitting regions located in different rows and closest to each other are centrosymmetric about a first point, wherein the first point is the geometric center of gravity of the first effective light-emitting region through which a connecting line of the geometric centers of gravity of the two second effective light-emitting regions passes;

and/or two third effective light-emitting regions located in different rows and closest to each other are centrosymmetric about a second point, wherein the second point is the geometric center of gravity of the first effective light-emitting region through which a connecting line of the geometric centers of gravity of the two third effective light-emitting regions passes.

In some embodiments of the present disclosure, in two adjacent second rows of effective light-emitting regions, a shape of the second effective light-emitting region located in one row is a mirror image of a shape of the second effective light-emitting region located in the other row along a mirror axis parallel to the row direction; and/or in two adjacent second rows of effective light-emitting regions, a shape of the third effective light-emitting region located in one row is a mirror image of a shape of the third effective light-emitting region located in the other row along a mirror axis that is parallel to the row direction.

In some embodiments of the present disclosure, the shape of the first effective light-emitting region is a rectangle or a rectangle with rounded corners.

In some embodiments of the present disclosure, long sides of the first effective light-emitting regions in the same column are located on a same straight line or parallel to each other.

In some embodiments of the present disclosure, long sides of at least two first effective light-emitting regions in the same column are not parallel to each other.

In some embodiments of the present disclosure, the display panel comprises: at least one rotated first effective light-emitting region, and an extension line of the long side of the rotated first effective light-emitting region forms an acute angle or obtuse angle with the row direction;

the second effective light-emitting region adjacent to the rotated first effective light-emitting region comprises an edge adjacent to the rotated first effective light-emitting region and parallel to an edge of the rotated first effective light-emitting region;

and/or a third effective light-emitting region adjacent to the rotated first effective light-emitting region comprises an edge adjacent to the rotated first effective light-emitting region and parallel to an edge of the rotated first effective light-emitting region.

In some embodiments of the present disclosure, in the same first row of effective light-emitting regions, two adjacent first effective light-emitting regions are axial symmetric, with an axis of symmetry parallel to the column direction.

In some embodiments of the present disclosure, the shape of the second effective light-emitting region is different from that of the third effective light-emitting region.

According to another aspect of the present disclosure, there is provided a display device, comprising: the above display panel according to the present disclosure.

According to a further aspect of the present disclosure, there is provided a method for manufacturing a display panel, comprising:

in a row direction, forming a plurality of first effective light-emitting regions that form a plurality of first rows of effective light-emitting regions, in the row direction, forming a plurality of second effective light-emitting regions and a plurality of third effective light-emitting regions, wherein the plurality of second effective light-emitting regions and the plurality of third effective light-emitting regions are alternately arranged to form a plurality of second rows of effective light-emitting regions;

wherein, the first rows of effective light-emitting regions and the second rows of effective light-emitting regions are alternately arranged in a column direction perpendicular to the row direction, and a virtual quadrilateral is formed by lines connecting geometric centers of gravity of four first effective light-emitting regions in two adjacent rows and two adjacent columns;

the geometric center of gravity of the second effective light-emitting region and the geometric center of gravity of the third effective light-emitting region are located in corresponding virtual quadrilaterals respectively;

the second effective light-emitting region comprises at least one first curved edge, and/or the third effective light-emitting region comprises at least one second curved edge.

DESCRIPTION OF THE DRAWINGS

In order to more clearly explain the technical solution of the embodiments of the present disclosure, a brief introduction will be given below for the drawings required to be used in the description of the present disclosure. It is obvious that, the drawings illustrated as follows are merely some embodiments of the present disclosure. For a person skilled in the art, he or she may also acquire other drawings according to such drawings on the premise that no inventive effort is involved.

FIG. 15 is a diagram showing still another layout structure of effective light-emitting regions and opening distribution on masks according to some embodiments of the present disclosure;

FIG. 16 shows a flowchart of a method of manufacturing a display panel according to some embodiments of the present disclosure.

DETAILED DESCRIPTION OF PREFERRED EMBODIMENTS

Figure 1:
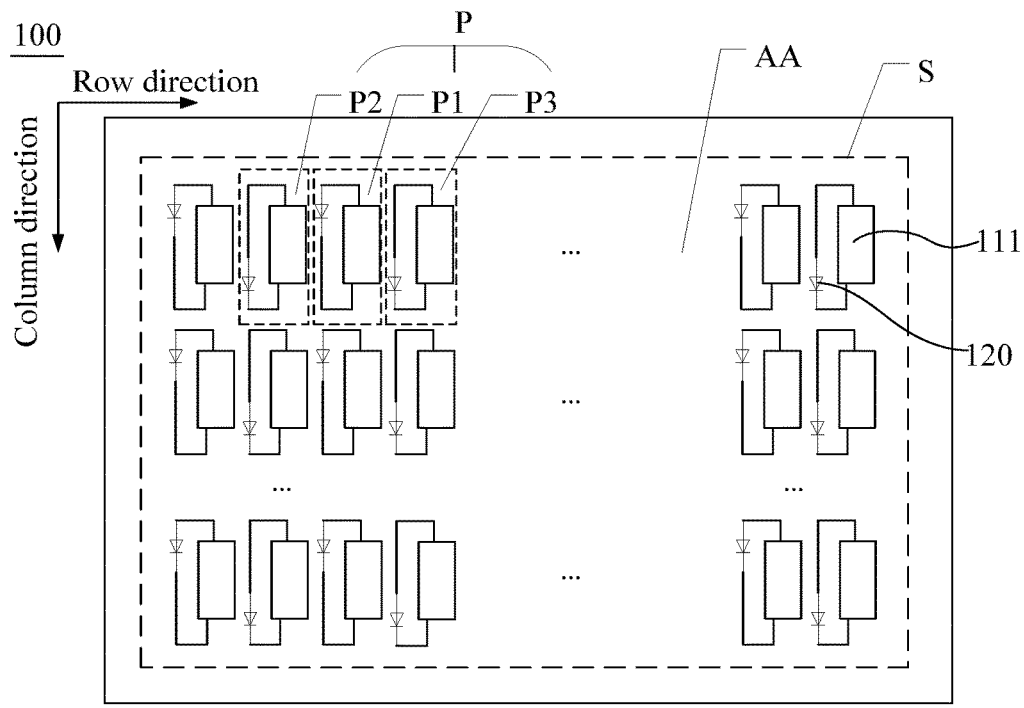
FIG. 1 is a top view of a display panel according to some embodiments of the present disclosure.

Below, a clear and complete description will be given for the technical solution of embodiments of the present disclosure with reference to the figures of the embodiments. Obviously, merely some embodiments of the present disclosure, rather than all embodiments thereof, are given hereinin. All other embodiments obtained by persons of ordinary skill in the art based on the embodiments of the present disclosure without creative efforts shall fall within the protection scope of the present disclosure.

In the description of the present disclosure, it is to be understood that the azimuth or positional relationship indicated by the terms "middle", "upper", "lower", "front", "back", "vertical", "horizontal", "top", "bottom", "inside", "outside" and the like is based on the azimuth or positional relationship shown in the drawings is merely for the purpose of facilitating the description of the present disclosure and simplified description, rather than indicating or implying that the device or element referred to must have a specific orientation, constructed and operated in a particular orientation and therefore can not be construed as limiting the present disclosure.

Throughout the specification and the claims which follow, unless the context requires otherwise, the word "comprise", and variations such as "comprises" and "comprising", will be understood to imply open-ended inclusion, i.e., "comprising but not limited to". In the description of this specification, reference throughout this specification to "one embodiment", "some embodiments", "illustrative embodiments", "examples", "specific examples", or "some examples" means that a particular feature, structure, material or characteristic described in connection with the embodiment is included in at least one embodiment of the present disclosure. Therefore, illustrative references to the above terms are not necessarily all referring to the same embodiment or example. In addition, the described features, structures, materials, or characteristics may be combined in any suitable manner in one or more embodiments.

Below, the terms "first" and "second" are used for descriptive purposes only, and are not to be construed as indicating or implying relative importance or implicitly indicating the number of indicated technical features. Thereby, features defined by "first", "second" may expressly or implicitly comprise one or more of the features. In the description of the embodiments of the present disclosure, unless otherwise indicated, the phrase "a plurality of" means "two or more".

In the description of some embodiments, the expressions "coupled" and "connected" and their extensions may be used. For example, the term "connected" may be used in the description of some embodiments to indicate that two or more components are in direct physical or electrical contact with each other. As another example, the term "coupled"

may be used in the description of some embodiments to indicate that two or more components have direct physical or electrical contact. However, the term "coupled" or "communicatively coupled" may also mean that two or more components are not in direct contact with each other, but still cooperate or interact with each other. The embodiments disclosed herein are not necessarily limited to the content herein.

"At least one of A, B, and C" has the same meaning as "at least one of A, B, or C", and both include the following combinations of A, B, and C: A only, B only, C only; the combination of A and B; the combination of A and C; the combination of B and C; and the combination of A, B and C.

"A and/or B" includes the following three combinations: A only, B only, and the combination of A and B.

Exemplary embodiments are described herein with reference to cross-sectional views and/or plan views as idealized exemplary drawings. In the drawings, the thickness of layers and regions is enlarged for clarity. Therefore, due to, for example, manufacturing technology and/or tolerances, changes in the shape with respect to the drawings are conceivable. Therefore, the exemplary embodiment should not be interpreted as being limited to the region shapes shown herein, but includes shape deviations caused by, for example, fabrication. For example, an etched region shown as a rectangle will usually have a curved feature. Therefore, the regions shown in the drawings are schematic in nature, and their shapes are not intended to show the actual shapes of the regions of the device, and are not intended to limit the scope of the exemplary embodiment.

Some embodiments of the present disclosure provide a display device. The display device refers to a product with image display function. For example, it may be a display, a television, a billboard, a digital photo frame, laser printer with display function, a telephone, a mobile phone, a personal digital assistant (PDA), a digital camera, a portable camera, a viewfinder, a monitor, a navigator, a vehicle, a large-area wall, a home appliance, an information query equipment (such as a business query equipment or a monitor of e-government, banking, hospital, electric power department, etc.).

In some embodiments, the display device includes, but is not limited to, a display panel. For example, it may further include a drive circuit board connected to the display panel, which is configured to provide electrical signals to the display panel to drive the display panel to display an image.

The display panel can be an OLED (Organic light-emitting Diode) display panel, a QLED (Quantum Dot light-emitting Diodes) display panel, a micro LED (including a miniLED or a microLED) display panel, etc.

FIG. 1 is a top view of a display panel 100 according to some embodiments of the present disclosure. The display panel 100 has an active area (AA) and a peripheral area S located on at least one side of the active area AA. For example, the peripheral area S can be disposed around the active area AA.

The display panel comprises a plurality of pixels arranged in the AA area, and each pixel can include a plurality of sub pixels P. For example, the sub-pixels P may be a first sub-pixel P1, a second sub-pixel P2, and/or a third sub-pixel P3. Each sub-pixel P can emit light of one color, and these three sub-pixels emit light of different colors. For example, these three sub-pixels can emit light of three primary colors, namely red, green and blue light respectively. That is, the plurality of sub pixels include red sub pixels, green sub pixels, and blue sub pixels. By controlling the light brightness of each sub-pixel P of the display panel, full-color display of the display panel can be realized.

Figure 2A:
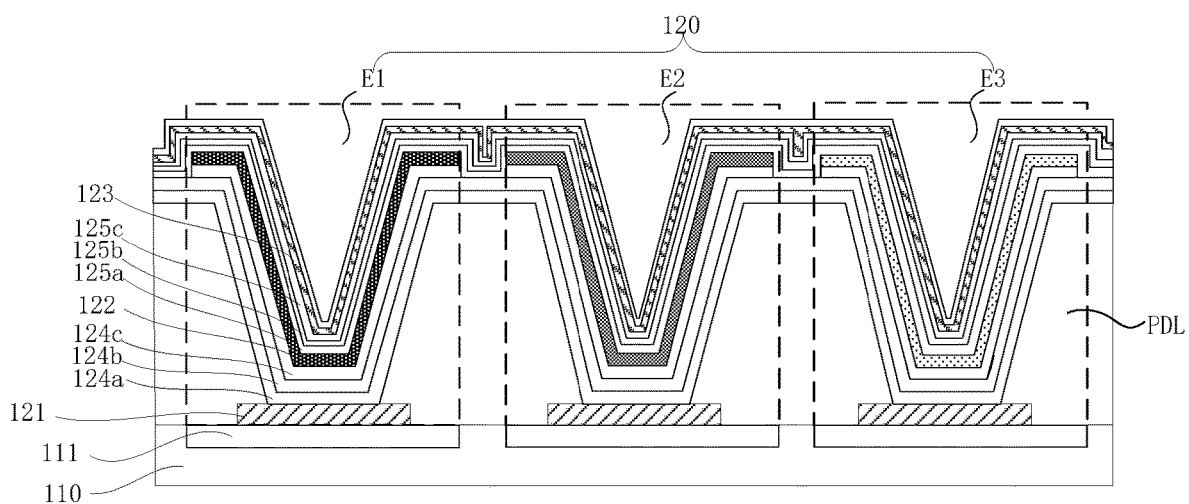
FIG. 2A is a sectional view of the display panel shown in FIG. 1.

In some embodiments, as shown in FIG. 2A, the display panel 100 includes a drive backplane 110 and a plurality of light-emitting devices 120. The plurality of light-emitting devices 120 are arranged on the drive backplane 110. The drive backplane 110 may be used to drive the light-emitting devices to emit light. For example, the drive backplane 110 includes a plurality of pixel circuits 111 (also referred to as pixel driving circuits), each coupled to a light-emitting device 120 and configured to drive the light-emitting device 120 to emit light. The plurality of light-emitting devices 120 include a first light-emitting device E1, a second light-emitting device E2 and a third light-emitting device E3, which may emit light of three primary colors, namely red, green and blue light respectively.

As shown in FIGS. 1 and 2A, each sub-pixel P may include a pixel circuit 111 and a light-emitting device 120. The pixel circuit 111 is coupled to the light-emitting device 120. Exemplarily, the plurality of pixel circuits 111 are arranged in an array. The plurality of pixel circuits 111 may be arranged in multiple rows. The arrangement direction of each row of pixel circuits is a row direction in FIG. 1, and the column direction is perpendicular to the row direction. Accordingly, light-emitting devices coupled to the same row of pixel circuits are called a row of light-emitting devices. In addition, the row direction and column direction in FIG. 1 are only illustrative, and can be interchanged.

Among the plurality of sub pixels P, the first sub-pixel P1 includes a first light-emitting device E1, the second sub-pixel P2 includes a second light-emitting device E2, and the third sub-pixel includes a third light-emitting device E3.

Moreover, there is no limit to the specific structure of the pixel circuit in the embodiment of the present disclosure, which can be designed according to the actual situation. Exemplarily, the pixel circuit may be composed of electronic devices such as a thin film transistor (TFT), a capacitor (C), etc. For example, the pixel circuit may include two thin film transistors (a switching transistor and a driving transistor) and a capacitor to form a 2T1C structure. Of course, the pixel circuit may also include more than two thin film transistors (a plurality of switching transistors and a driving transistor) and at least one capacitor. For example, the pixel circuit may include one capacitor and seven transistors to form a 7T1C structure. The light-emitting device is the main structure of a sub-pixel to realize light emission. Each light-emitting device may be a multi-layered structure of superimposed films. FIG. 2A is a partial cross-sectional view of an OLED display panel provided in some embodiments of the present disclosure. Referring to FIG. 2A, the light-emitting device 120 may include an anode 121, a light-emitting layer 122, and a cathode 123; it may further include at least one of a hole injection layer 124a, a hole transport layer 124b, and an electron barrier layer 124c located between the anode 121 and the light-emitting layer 122, and at least one of the electron injection layer 125c, the electron transport layer 125b, and the hole barrier layer 125a located between the cathode 123 and the light-emitting layer 122. The anode 121 and cathode 123 are used to provide a voltage. The hole injection layer 124a and the hole transport layer 124b are used to inject and transport holes. The electron injection layer 125c and the electron transport layer 125b are used to inject and transport electrons. The electron barrier layer 124c is used to block electrons from the cathode from entering the hole transport layer 124b. The hole barrier layer 125a is used to block holes from the anode from entering the electron transport layer 125b. Holes from the anode 121 reach the light-emitting layer 122 through the hole injection layer 124*a*, the hole transport layer 124*b* and the electron barrier layer 124*c*, and electrons from the cathode 123 also reach the light-emitting layer 122 through the electron injection layer 125*c*, the electron transport layer 125*b* and the hole barrier layer 125*a*. Finally, the holes combine with the electrons in the light-emitting layer 122 to form excitons and radiate light.

Figure 2B:
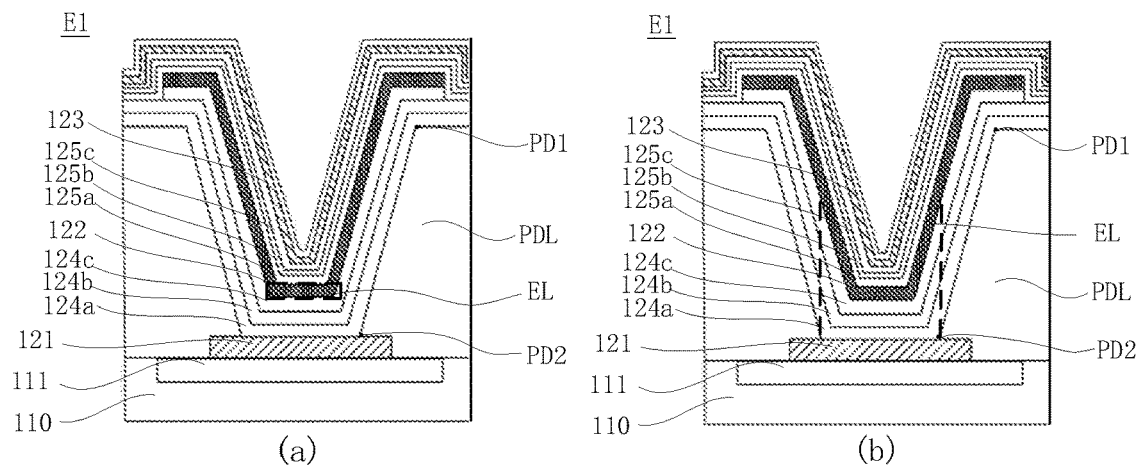
FIG. 2B is an enlarged view of a first light-emitting device of the display panel shown in FIG. 2A.

The light-emitting layer 122 described above may refer to a pattern made by an evaporation process. However, due to the production process, only a portion of the light-emitting layer can actually emit light, that is, a portion where holes combine with electrons in the light-emitting layer to emit light. This portion that can emit light is called an effective light-emitting region EL. For example, the drive backplane 110 further includes a pixel definition layer (PDL), which is provided with a plurality of openings, with a portion of the light-emitting layer located within the openings and a portion located outside the openings. The effective light-emitting region EL may be a portion of the light-emitting layer located within the openings. Referring to FIG. 2B (a), for example, the effective light-emitting region EL may be a portion of the light-emitting layer located within the opening and parallel to the anode 121. As another example, referring to FIG. 2B (b), the opening includes an upper edge PD1 and a lower edge PD2. A projection of the effective light-emitting region EL on the anode 121 along the thickness direction of the drive backplane 110 coincides with the lower edge PD2. As still another example, by lighting the display panel, an edge of the effective light-emitting region can be determined by the contour line of the light-emitting region in the light-emitting device.

Exemplarily, the light-emitting layer 122 has substantially the same shape as the effective light-emitting region EL contained therein. For example, there is a gap between the edge of the light-emitting layer 122 and the edge of the effective light-emitting region EL, and a ratio of the width of the gap at any place to an average width of the gap is $1 \pm \alpha$, that is, within the range of $[1-\alpha, 1+\alpha]$, for example, $\alpha$ can be less than or equal to 0.3, for example, equal to 0.2, 0.1, etc. Wherein, the width of the gap at any place refers to a distance from any point on the edge of the effective light-emitting region EL to the edge of the light-emitting layer 122 along the normal direction of the edge of the effective light-emitting region EL.

The first light-emitting device E1, the second light-emitting device E2 and the third light-emitting device E3 may all have the multi-layered structure described above.

The effective light-emitting region in the first light-emitting device E1 is called a first effective light-emitting region EL1, the effective light-emitting region in the second light-emitting device E2 is called a second effective light-emitting region EL2, and the effective light-emitting region in the third light-emitting device E3 is called the third effective light-emitting region EL3. The difference is that the first effective light-emitting region EL1, the second effective light-emitting region EL2 and the third effective light-emitting region EL3 can have different sizes and shapes, and are evaporated with different light-emitting materials respectively, so as to emit light of different colors.

Figure 3:
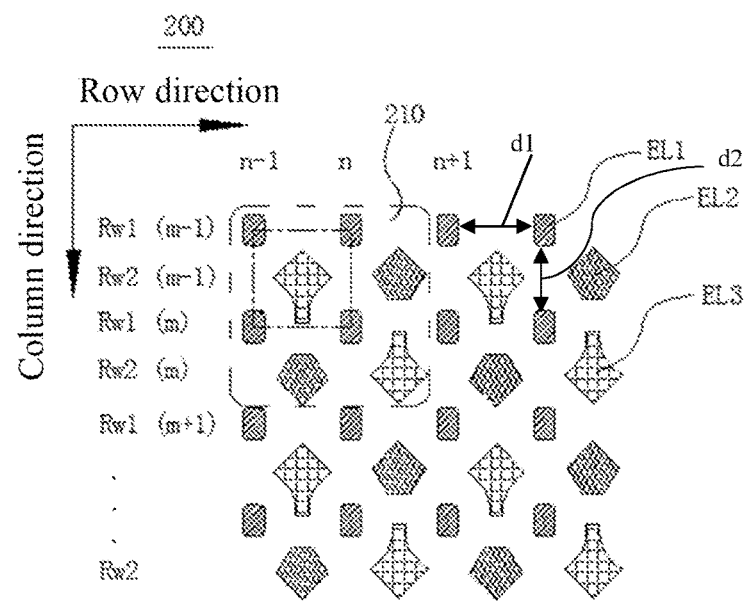
FIG. 3 is a layout structure diagram of the various effective light-emitting regions according to some embodiments of the present disclosure.
Figure 4:
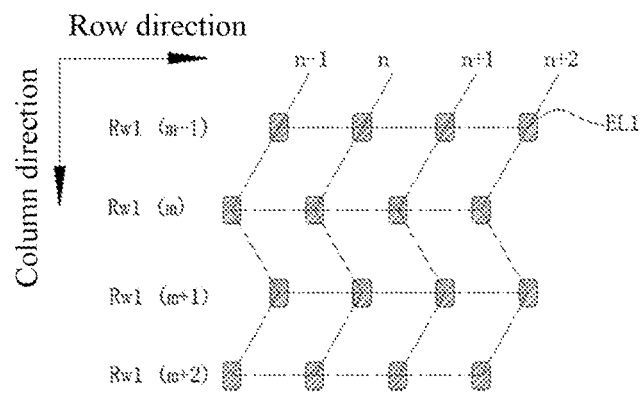
FIG. 4 is a layout structure diagram of the first effective light-emitting regions according to some embodiments of the present disclosure.

As shown in FIG. 3, in the row direction, a plurality of first effective light-emitting regions EL1 form a plurality of first rows of effective light-emitting regions Rw1, a plurality of second effective light-emitting regions EL2 and a plurality of third effective light-emitting regions EL3 are alternately arranged to form a plurality of second rows of effective light-emitting regions Rw2. The first rows of effective light-emitting regions Rw1 and the second rows of effective light-emitting regions Rw2 are alternately arranged in the column direction. A virtual quadrilateral is formed by lines connecting geometric center of gravities of four first effective light-emitting regions EL1 arranged in two adjacent first rows of effective light-emitting regions Rw1 and two adjacent columns. Exemplarily, the plurality of first effective light-emitting regions EL1 are arranged in an array to form a plurality of virtual quadrilaterals, each virtual quadrilateral having the geometric center of gravities of the four first effective light-emitting regions EL1 as the vertexes. For example, the plurality of first effective light-emitting regions EL1 are arranged in a plurality of rows, the first effective light-emitting regions EL1 in each row being arranged at equal intervals along the row direction, and the distance between two adjacent first effective light-emitting regions EL1 is a first distance d1; the plurality of rows of the first effective light-emitting regions are arranged at equal intervals along the column direction, and the distance between two adjacent rows of the first effective light-emitting regions EL1 is a second distance d2, thereby forming an array. The first distance d1 in the array may be equal to the second distance d2, or they may not be equal. In the array, a virtual quadrilateral can be formed by connecting the geometric center of gravities of the closest four first effective light-emitting regions ELL "The closest four" means the nth first effective light-emitting region in row m, the (n+1)th first effective light-emitting region in row m, the nth first effective light-emitting region in row m+1 and the (n+1)th first effective light-emitting region in row m+1 of the array. Row m and row m+1 refer to two adjacent rows; the nth first effective light-emitting region and (n+1)th first effective light-emitting region in the same row are two adjacent first effective light-emitting regions. All the nth first effective light-emitting regions in the rows constitute column n; all the (n+1)th first effective light-emitting regions in the rows constitute column n+1. Column n and column n+1 are two adjacent columns, and m and n are positive integers. For example, as shown in FIG. 3, a rectangle is formed by connecting the geometric center of gravities of the closest four first effective light-emitting regions EL1 in the upper left corner. However, the quadrilateral may also be a parallelogram, a diamond or a square. For example, the virtual quadrilateral formed by the arrangement of the first effective light-emitting regions shown in FIG. 4 is a parallelogram. Each first effective light-emitting region EL1 is located on a vertex of the virtual quadrilateral.

The geometric center of gravity of a second effective light-emitting region EL2 (e.g., each of the plurality of second effective light-emitting regions EL2) is located within a virtual quadrilateral, and the geometric center of gravity of a third effective light-emitting region EL3 (e.g., each of the plurality of third effective light-emitting regions EL3) is located within a virtual quadrilateral. However, a second effective light-emitting region EL2 or a third effective light-emitting region EL3 may completely fall within the virtual quadrilateral where its geometric center of gravity is located, or may have a portion outside the virtual quadrilateral where its geometric center of gravity is located. For example, a second effective light-emitting region EL2 is completely located in a virtual quadrilateral. As another example, a first portion of a second effective light-emitting region EL2 is located within a virtual quadrilateral where its geometric center of gravity is located, and a second portion of the second effective light-emitting region EL2 is located outside the boundary of the virtual quadrilateral, the area of the first portion is greater than that of the second portion.

Similarly, the third effective light-emitting region EL3 can also be distributed as described above, which will not be repeated herein. The plurality of second effective light-emitting regions EL2 and the plurality of third effective light-emitting regions EL3 can be alternately distributed along the row direction and the column direction, that is, as shown in FIG. 3, one second effective light-emitting region EL2 and one third effective light-emitting region EL3 are respectively arranged in each two adjacent virtual quadrilaterals along the row direction or the column direction. In this way, a minimum repetition unit 210 can be selected from the layout structure of the effective light-emitting regions, which includes four first effective light-emitting regions EL1, two second effective light-emitting regions EL2, and two third effective light-emitting regions EL3.

Each virtual quadrilateral formed by the array of first effective light-emitting regions EL1 can be provided with one second effective light-emitting region EL2 or one third effective light-emitting region EL3, but not every second effective light-emitting region EL2 or third effective light-emitting region EL3 can be located in a virtual quadrilateral. For example, if a second effective light-emitting region EL2 or a third effective light-emitting region EL3 is located in the last row or column, its geometric center of gravity cannot fall in a virtual quadrilateral.

The shape of an effective light-emitting region is a geometry surrounded by a plurality of (for example, at least three) edges, each edge is a straight edge or a curved edge. For example, the plurality of edges can be directly connected end to end to form the edge of the effective light-emitting region. For another example, among the plurality of edges, at least two adjacent edges can be connected by a rounded corner. The curved edge can be an arc edge (including a circular arc edge or an elliptical arc edge), or a wavy edge, etc. Exemplarily, the first effective light-emitting region EL1 is a quadrilateral surrounded by four straight edges, such as a rectangle; it can also be a quadrilateral with rounded corners, that is, having at least two straight edges connected by a rounded corner. Compared with sharp corners, rounded corners are more conducive to reduce glare due to their softer transition. For example, as shown in FIG. 3, the first effective light-emitting region EL1 may be a rectangle with rounded corners. For example, among the four straight edges, each two adjacent straight edges are connected by a rounded corner.

At least one of the edges of the second effective light-emitting region EL2 and the edges of the third effective light-emitting region EL3 includes a curved edge. The curved edge in the edges of the second effective light-emitting region EL2 is called a first curved edge, and the curved edge in the edges of the third effective light-emitting region is called the second curved edge. That is, in one example, the second effective light-emitting region EL2 has a first curved edge, while there is no curved edge in the edges of the third effective light-emitting region EL3. In this case, the third effective light-emitting region EL3 may be a polygon composed of straight edges or a polygon with rounded corners, such as a pentagon, a hexagon, etc. In another example, the third effective light-emitting region EL3 has a second curved edge, and there is no curved edge in the edges of the second effective light-emitting region EL2. In another example, the second effective light-emitting region EL2 has a first curved edge, and the third effective light-emitting region EL3 has a second curved edge.

Figure 5:
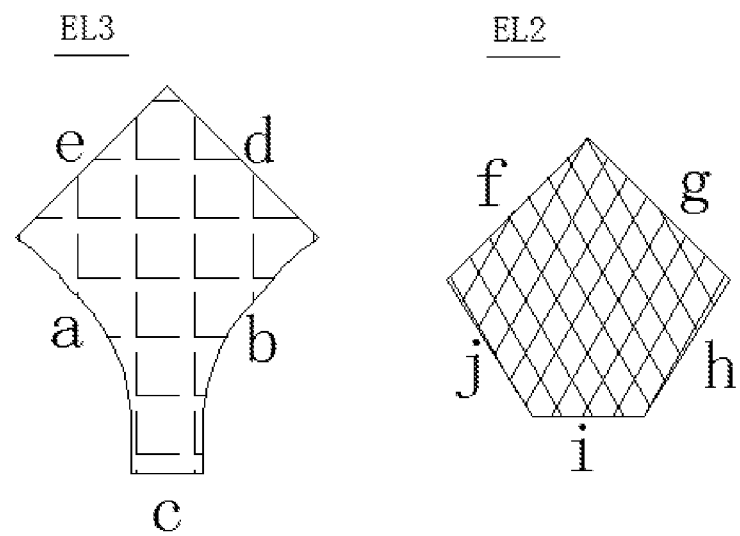
FIG. 5 is an enlarged view of a third effective light-emitting region and a second effective light-emitting region in the layout structure of effective light-emitting regions shown in FIG. 3.

In some embodiments, as shown in FIG. 5, the shape of the second effective light-emitting region EL2 is different from that of the third effective light-emitting region EL3.

For example, the third effective light-emitting region EL3 is an axial symmetric pattern surrounded by five edges a, b, c, d and e, with an axis of symmetry parallel to the column direction, and edges including two curved edges a and b and three straight edges c, d and e, wherein curved edges a and b are second curved edges. For example, the edges of the second effective light-emitting region EL2 are all straight edges. For example, the second effective light-emitting region EL2 is a pentagon formed by five straight edges f, g, h, i and j.

In some embodiments, the third effective light-emitting region EL3 has an even number of second curved edges, and is an axial symmetric pattern. Wherein, the symmetry axis of the axial symmetric pattern can be parallel to the column direction or row direction. For example, as shown in FIG. 5, the third effective light-emitting region EL3 is an axial symmetric pattern with two second curved edges a and b that are symmetrical along the column direction.

Figure 6:
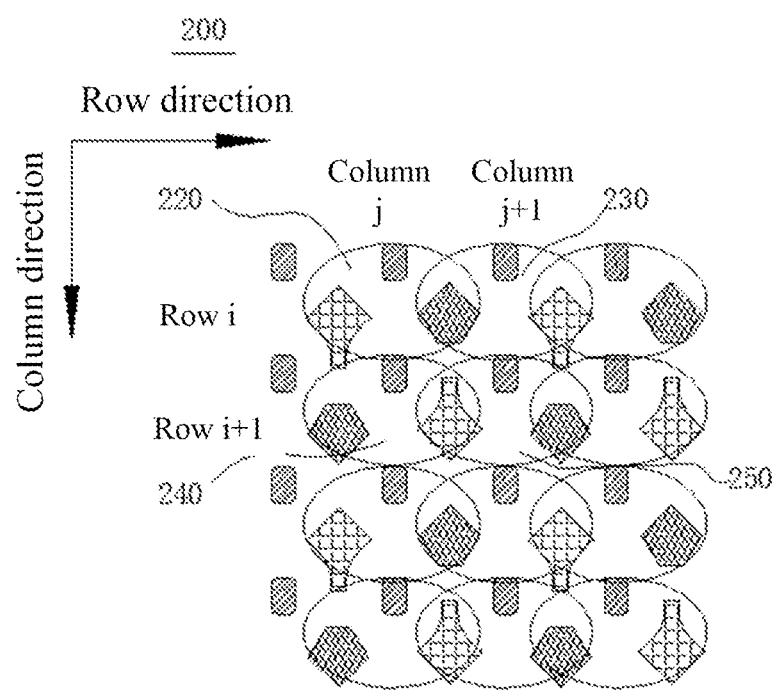
FIG. 6 is a schematic diagram of pixels composed of the layout structure of effective light-emitting regions shown in FIG. 3.

Similarly, the second effective light-emitting region EL2 has an even number of first curved edges and is an axial symmetric pattern. Wherein, the symmetry axis of the axial symmetric pattern can be parallel to the column direction or row direction. In the display panel provided in some embodiments of the present disclosure, in the row direction, a plurality of first effective light-emitting regions EL1 form a plurality of first rows of effective light-emitting regions Rw1, a plurality of second effective light-emitting regions EL2 and a plurality of third effective light-emitting regions EL3 are alternately arranged to form a plurality of second rows of effective light-emitting regions Rw2, the first and second rows of effective light-emitting regions Rw1 and Rw2 being alternately arranged in the column direction, wherein the geometric center of gravities of the second effective light-emitting regions EL2 and the geometric center of gravities of the third effective light-emitting regions EL3 are respectively located in virtual quadrilaterals formed by the arrangement of the first effective light-emitting regions, such that the second sub-pixel and the third sub-pixel can be shared by adjacent pixels in the row direction, thereby improving the resolution of the display panel. For example, as shown in FIG. 6, each ellipse represents a pixel. For example, the pixel 220 in row i and column j and the pixel 230 in the row i and column j+1 share the second sub-pixel therebetween, and the pixel 240 in row i+1 and column j and the pixel 250 in row i+1 and column j+1 share the third sub-pixel therebetween. By sharing the sub-pixel, more pixels can be accommodated in a given area of AA region, so as to improve the resolution of the display panel. In addition, as can be seen from FIG. 6, each pixel has uniform size and position in the row and column directions, which is also conducive to a clear display effect and reducing jagged and grainy feeling.

In addition, in some embodiments of the present disclosure, a mask for evaporating the light-emitting layer in the first sub-pixels (the light-emitting layer including the first effective light-emitting regions EL1) is called a first mask, and a mask for evaporating the light-emitting layer in the second sub-pixels (the light-emitting layer including the second effective light-emitting regions EL2) is called a second mask, and a mask for evaporating the light-emitting layer in the third sub-pixels (the light-emitting layer including the third effective light-emitting regions EL3) is called a third mask.

Figure 7:
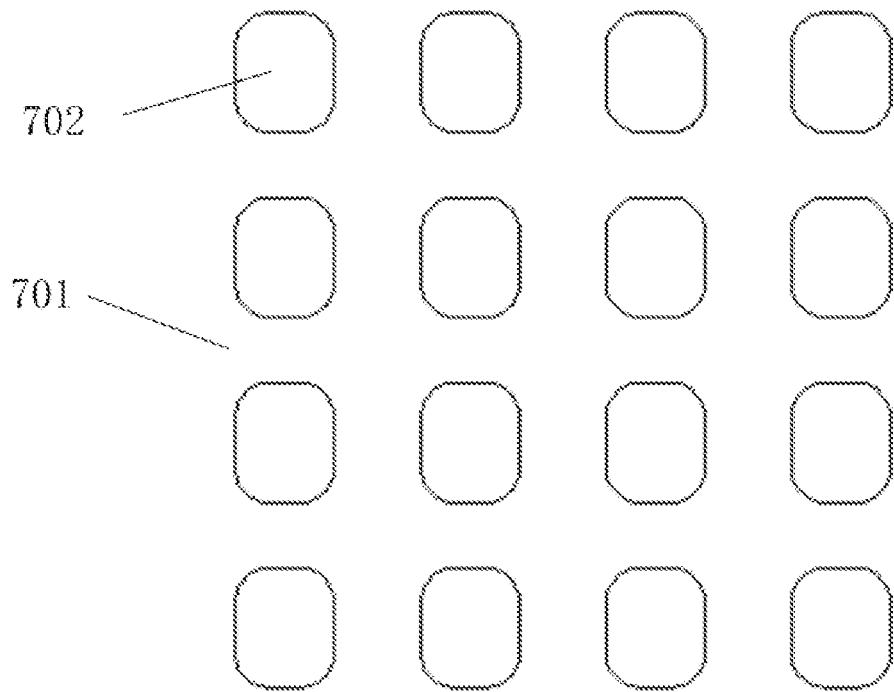
FIG. 7 is a distribution diagram of openings on a first mask according to some embodiments of the present disclosure.

The first effective light-emitting regions EL1 in the above embodiment has the largest number and the smallest size. Therefore, compared with the second mask and the third mask, the fabrication and stretching of the first mask are technical bottlenecks. FIG. 7 is a schematic diagram of the openings on the first mask of this embodiment. It can be seen from FIG. 7 that on the first mask, a plurality of openings are arranged in an array, that is, evenly distributed, which not only reduces the difficulty in the fabrication of the first mask, but also is very beneficial to the stretching process. Specifically, the solid region (i.e. the region on the first mask other than the openings 702) 701 of the first mask has regular edges in the row and column directions. When the first mask is stretched, the force is transmitted evenly, so that the overall stretching stability of the first mask is high and the deformation is small, thereby ensuring the manufacturing accuracy and stability of the light-emitting regions.

Figure 8:
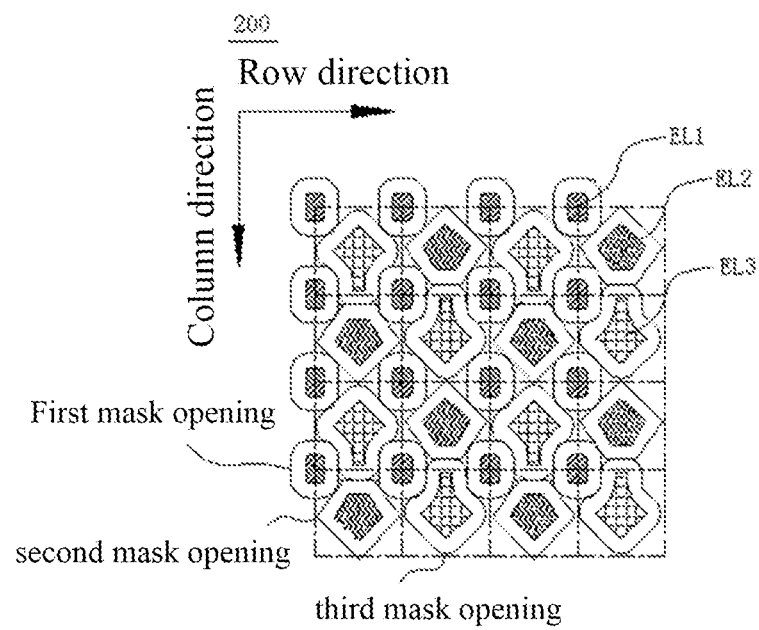
FIG. 8 is diagram showing a layout structure of effective light-emitting regions and opening distribution on masks according to some embodiments of the present disclosure.
Figure 9:
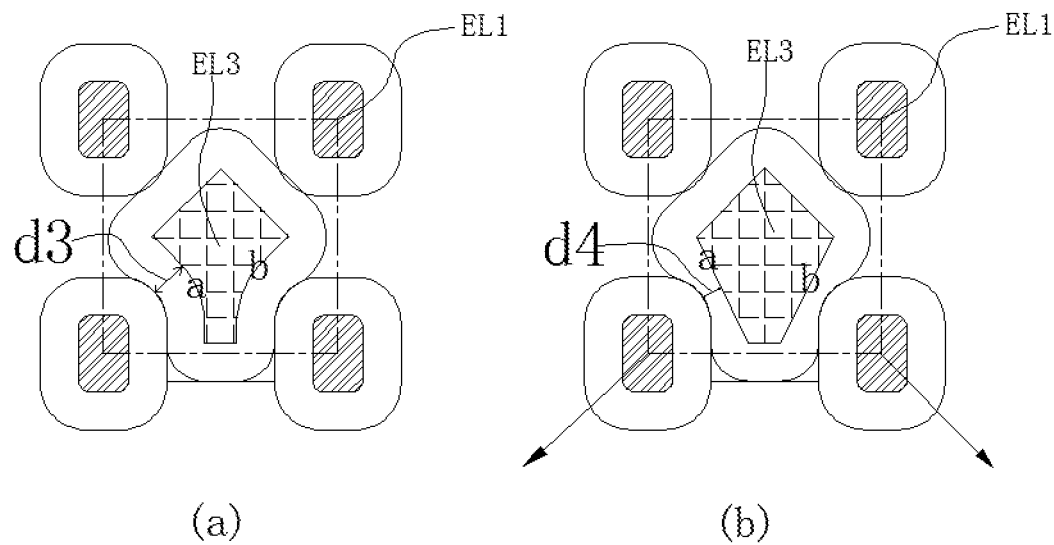
FIG. 9 is a comparison diagram of a third effective light-emitting region without curved edges and a third effective light-emitting region with curved edges according to some embodiments of the present disclosure.

In addition, in the above embodiment, the second effective light-emitting region EL2 and/or the third effective light-emitting region EL3 have curved edges. Due to the flexibility of curvature of the curved edges, the area of the second effective light-emitting region EL2 and/or the third effective light-emitting region EL3 can be adjusted without changing the position of adjacent light-emitting layers, thereby making the entire layout design of the effective light-emitting regions easier. Exemplarily, FIG. 8 shows a layout structure of effective light-emitting regions and openings on a mask according to the above embodiment. As can be seen from FIG. 8, the opening on the mask is not completely consistent with the shape of the effective light-emitting region, but is expanded to be a little larger along the edges of the effective light-emitting region. This is because there may be certain manufacturing deviations in the manufacturing of the mask and the actual evaporation process. In order to enable an effective light-emitting region to be evaporated and fully filled with an organic light-emitting material, the openings on the mask need to be larger than the effective light-emitting region, so as to form a light-emitting layer corresponding to the opening on the mask. If the minimum expansion distance of an opening on the mask relative to the edge of an effective light-emitting region to meet the manufacturing deviation is called a minimum deviation distance, the minimum distance between two adjacent effective light-emitting regions is twice the minimum deviation distance, which limits the adjustment of the area of the effective light-emitting region for each sub-pixel. The embodiment of the present disclosure can solve this problem by means of the curved edges in the edges of the effective light-emitting region. For example, as shown in FIG. 9 (a), the minimum deviation distance between the edge of the third effective light-emitting region EL3 and the opening on the third mask is d3. As shown in FIG. 9 (b), if the edges a and b of the third effective light-emitting region EL3 are straight edges, because the straight edges cannot be concave inward, the distance d4 from the edge a or b to the opening of mask is less than the minimum deviation distance d3 between the light-emitting region and the mask. In this case, in order to ensure the minimum deviation distance d3, it is required to change the position of the first effective light-emitting region EL1 or even the position of the second effective light-emitting region EL2 adjacent to the third effective light-emitting region EL3. For example, the first effective light-emitting region EL1 is moved in the direction indicated by the arrow shown in FIG. 9 (b). As a result, the positions of other patterns (such as, the anode) in the first light-emitting device including the first effective light-emitting region EL1, as well as the position of the pixel circuit coupled with the first light-emitting device, need to be changed, which makes the design of the display panel complex. However, if the edges of the effective light-emitting region include curved edges, as shown in FIG. 9 (a), the third effective light-emitting region EL3 can be fully expanded in the row direction and column direction in the virtual quadrilateral to which its geometric center of gravity belongs. In cooperation with arc transition adjustment of the curved edges that is made at the position corresponding to the adjacent first effective light-emitting region EL1, a required light-emitting area can be achieved without affecting the surrounding effective light-emitting regions.

In some embodiments, the first sub-pixel is configured to emit green light, and is referred to as G sub-pixel; the second sub-pixel is configured to emit red light and is referred to as R sub-pixel; the third sub-pixel is configured to emit blue light and is referred to as B sub-pixel. Because the human eyes are more sensitive to green light, and G sub-pixels are not shared in this embodiment, that is, have the same amount as that of real pixels, the display effect of images can be improved subjectively.

In some embodiments, in a first effective light-emitting region EL1 closest to a second curved edge of a third effective light-emitting region EL3, the shape of a portion (second portion) close to the second curved edge corresponds to the shape of the second curved edge. If the second curved edge of the third effective light-emitting region EL3 is concave, the shape of the second portion of the first effective light-emitting region EL1 closest to the second curved edge is convex, and vice versa. For example, referring to FIGS. 5 and 8, the second curved edge a of the third effective light-emitting region EL3 is a concave curved edge, and the second portion of the first effective light-emitting region EL1 closest to the second curved edge a is the upper right rounded portion of the first effective light-emitting region EL1 at the lower left of the third effective light-emitting region EL3, and the second portion of the first effective light-emitting region EL1 closest to the second curved side b is the upper left rounded portion of the first effective light-emitting region EL1 at the lower right of the third effective light-emitting region EL3, which is conducive to the effective utilization of space, improving space utilization, and making the arrangement of light-emitting regions more compact.

Similarly, in the first effective light-emitting region EL1 closest to the first curved edge of the second effective light-emitting region EL2, the shape of the first portion close to the first curved edge corresponds to the shape of the first curved edge. For details, reference can be made to the shape of the third effective light-emitting region EL3, which will not be repeated herein.

In some embodiments, a portion of the edge of the third effective light-emitting region EL3 is located between two adjacent first effective light-emitting regions EL1 to increase the area of the light-emitting region. The two adjacent first effective light-emitting regions EL1 may be arranged in the row direction or in the column direction. For example, a portion of the edge of the third effective light-emitting region EL3 extends between two adjacent first effective light-emitting regions EL1 arranged along the row direction. In this case, the third effective light-emitting region EL3 has a portion directly facing the two first effective light-emitting regions EL1 along the row direction. A third effective light-emitting region EL3 can be completely located in a virtual quadrilateral or may extend outside the edges of the virtual quadrilateral. The size and shape of the third effective light-emitting region EL3 are adjustable. When it is necessary to increase its light-emitting area, a portion of its edges can be extended to a position between the two first effective light-emitting regions EL1 in the quadrilateral region. Exemplarily, the edges of the third effective light-emitting region EL3 include at least two second curved edges and a second straight edge, wherein the two second curved edges are connected with the ends of the second straight edge, the second straight edge being located between two adjacent first effective light-emitting regions EL1 in the row direction or column direction. For example, as shown in FIGS. 5 and 8, the third effective light-emitting region EL3 includes a second straight edge c, and the second straight edge c is parallel to the row direction. The second curved edges a and b are respectively connected with the ends of the second straight edge c, and the second straight edge c of the third effective light-emitting region EL3 is located between two first effective light-emitting regions EL1 in the lower left corner and the lower right corner of the third effective light-emitting region EL3. In cooperation with the adjustment of the shape of the two second curved edges a and b, it is possible to make the area of the third effective light-emitting region EL3 the largest of the three regions without changing the positions of other effective light-emitting regions as much as possible.

Similarly, a portion of the edges of the second effective light-emitting region EL2 is located between two adjacent first effective light-emitting regions ELL Exemplarily, the edges of the second effective light-emitting region EL2 includes at least two first curved edges and a first straight edge, wherein the two first curved edges are connected with the ends of the first straight edge, the first straight edge being located between two adjacent first effective light-emitting regions EL1 in the row direction or column direction.

In order to clearly and concisely describe the scheme, the definitions of several geometric center of gravities will be given in this embodiment: first geometric center of gravity is the geometric center of gravity of a first effective light-emitting region EL1; second geometric center of gravity is the geometric center of gravity of a second effective light-emitting region EL2 adjacent to the first effective light-emitting region; and third geometric center of gravity is the geometric center of gravity of a third effective light-emitting region EL3 adjacent to the first effective light-emitting region.

As the third effective light-emitting region EL3 or the second effective light-emitting region EL2 extends to the position between two adjacent first effective light-emitting regions ELL its geometric center of gravity will deviate from the geometric center of gravity of the virtual quadrilateral where it is located, so that the distance between the first geometric center of gravity and the second geometric center of gravity is not equal to the distance between the first geometric center of gravity and the third geometric center of gravity.

For example, as shown in FIG. 3, since the edges of the third effective light-emitting region EL3 in row m−1 extends to a certain extent to the first effective light-emitting region EL1 in row m, the geometric center of gravity of the third effective light-emitting region EL3 in row m−1 is closer to the first effective light-emitting region EL1 in row m than that of the second effective light-emitting region EL2 in the same row. Similarly, the geometric center of gravity of the third effective light-emitting region EL3 in row m is also closer to the first effective light-emitting region EL1 in row m than the geometric center of gravity of the second effective light-emitting region EL2 in the same row, so that for a first effective light-emitting region EL1 in row m, the distance between the geometric center of gravity of the first effective light-emitting region EL1 and the third effective light-emitting region EL3 in the adjacent row m−1 (or row m) is not equal to the distance between the geometric center of gravity of the first effective light-emitting region EL1 and the adjacent second effective light-emitting region EL2 in the row m−1 (or row m).

Figure 10:
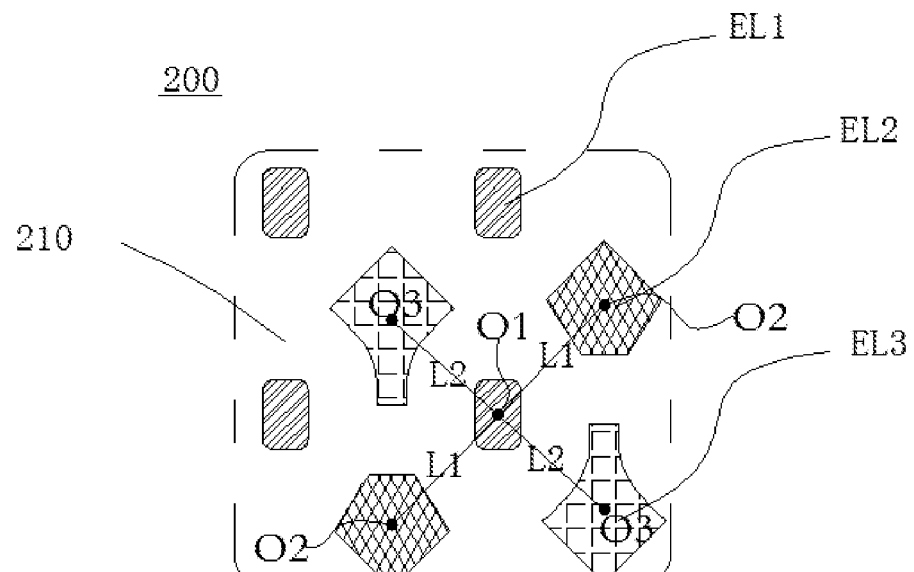
FIG. 10 is a schematic diagram of the relative positions of different effective light-emitting regions in a minimum repetition unit of the layout structure of effective light-emitting regions shown in FIG. 3.

For example, as shown in FIG. 10, in a minimum repetition unit 210 of the layout structure 200 of the effective light-emitting regions, taking the geometric center of gravity O1 of the first effective light-emitting region EL1 located between two second effective light-emitting regions EL2 as a reference, the two second geometric center of gravities O2 may have an equal distance L1 to the first geometric center of gravity O1, and the two third geometric center of gravities O3 may have an equal distance L2 to the first geometric center of gravity O1, with L2<L1. In addition, the midpoint of the connecting line between the two second geometric center of gravities O2 may coincide with the first geometric center of gravity O1. The midpoint of the connecting line between the two third geometric center of gravities O3 may also coincide with the first geometric center of gravity O1. In this way, the plurality of second effective light-emitting regions EL2 and the plurality of third effective light-emitting regions EL3 can be distributed more evenly. As another example, the distance from the first geometric center of gravity O1 to the third geometric center of gravity O3 may be greater than the distance from the first geometric center of gravity O1 to the second geometric center of gravity O2, that is, L2>L1.

Figure 11:
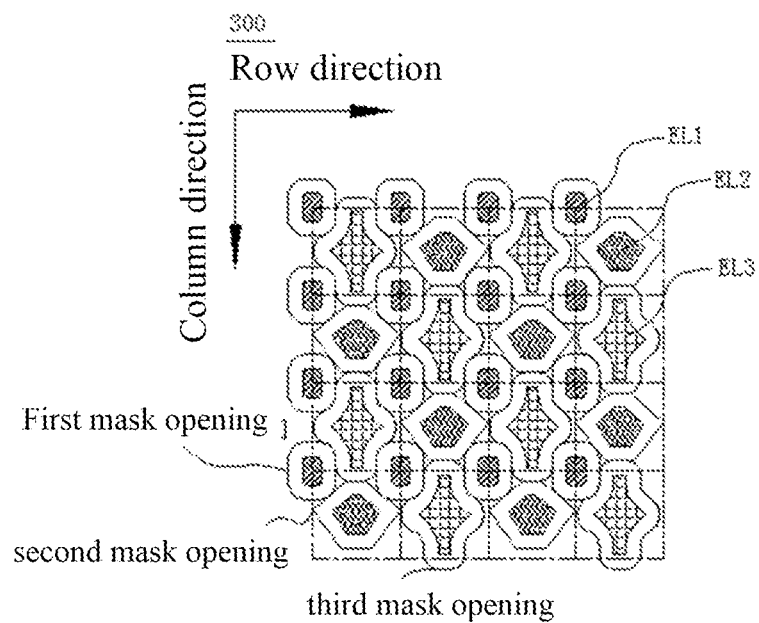
FIG. 11 is a diagram showing another layout structure of effective light-emitting regions and opening distribution on masks according to some embodiments of the present disclosure.

In some embodiments, the third effective light-emitting region EL3 may have an even number of second curved edges and is an axial symmetric pattern. For example, as shown in FIG. 11, in the layout structure 300 of the effective light-emitting regions, the third effective light-emitting region EL3 has four second curved edges, which are symmetrical with respect to the two symmetry axes of the third effective light-emitting region EL3, wherein the two symmetry axes of the third effective light-emitting region EL3 are a symmetry axis parallel to the row direction and a symmetry axis parallel to the column direction, respectively.

Similarly, the second effective light-emitting region EL2 may also have an even number of second curved edges and is an axial symmetric pattern. As shown in FIG. 11, the second effective light-emitting region EL2 may be a polygon connected by straight edges, such as a hexagon. The second effective light-emitting region EL2 is an axial symmetric pattern, and its symmetry axis is parallel to the column direction. In addition, the lengths of the two straight edges parallel to the row direction of the second effective light-emitting region EL2 are not equal.

In some embodiments, in two adjacent second rows of effective light-emitting regions RW2, each second effective light-emitting region EL2 has the same shape and size. Alternatively, in two adjacent second rows of effective light-emitting regions Rw2, for two second effective light-emitting regions EL2 located in different rows, one of the second effective light-emitting regions EL2 has the same shape and size as a mirror image of the other second effective light-emitting region EL2 relative to a mirror axis parallel to the row direction. For example, referring to FIGS. 11 and 12, in the layout structure 300 of the effective light-emitting regions shown in FIG. 11, all the second effective light-emitting regions EL2 are not only the same in size and shape, but also the same in the orientation at their respective positions, while in the layout structure 400 of the effective light-emitting regions shown in FIG. 12, although two second effective light-emitting regions EL2 in two adjacent second rows of effective light-emitting regions Rw2 located in different rows have the same shape and size, their orientation at the respective positions differs by 180°.

Since the shape of the second effective light-emitting region EL2 is an axial symmetric pattern with only one axis of symmetry that is parallel to the column direction, the second effective light-emitting region EL2, after being rotated by 180°, cannot coincide with itself prior to the rotation. In this way, the same effective light-emitting region can be provided in different orientation by using the asymmetry of the shape of the effective light-emitting region, so that the overall layout structure of the effective light-emitting regions is more uniform and consistent, which is conducive to the improvement of the display effect.

Similarly, in two adjacent second effective light-emitting regions, the third effective light-emitting regions EL3 have the same shape and size. Alternatively, for two third effective light-emitting regions EL3 in two adjacent second rows of effective light-emitting regions located in different rows, one of the third effective light-emitting regions EL3 has the same shape and size and as a mirror image of the other third effective light-emitting region EL3 with respect to a mirror axis parallel to the row direction.

In some embodiments, two second effective light-emitting regions EL2 located in different rows and closest to each other are centrosymmetric with respect to a first point, wherein the first point is the geometric center of gravity of a first effective light-emitting region EL1 through which a connecting line between the geometric center of gravities of the two second effective light-emitting regions EL2 closest to each other passes. As described above, referring to FIG. 10, two second effective light-emitting regions EL2 located in different rows and closest to each other may be two second effective light-emitting regions EL2 within a minimum repetition unit 210 of the layout structure 200 of the effective light-emitting regions. If the midpoint of the connecting line between the geometric center of gravities O2 of the two second effective light-emitting regions EL2 coincides with the geometric center of gravity O1 of the first effective light-emitting region EL1 located therebetween, the two second effective light-emitting regions EL2 must be centrosymmetric about O1, and O1 is the first point described above.

Similarly, two third effective light-emitting regions EL3 located in different rows and closest to each other are centrosymmetric with respect to a second point, wherein the second point is the geometric center of gravity of a first effective light-emitting region EL1 through which a connecting line between the geometric center of gravities of the two third effective light-emitting regions EL3 closest to each other passes.

Figure 12:
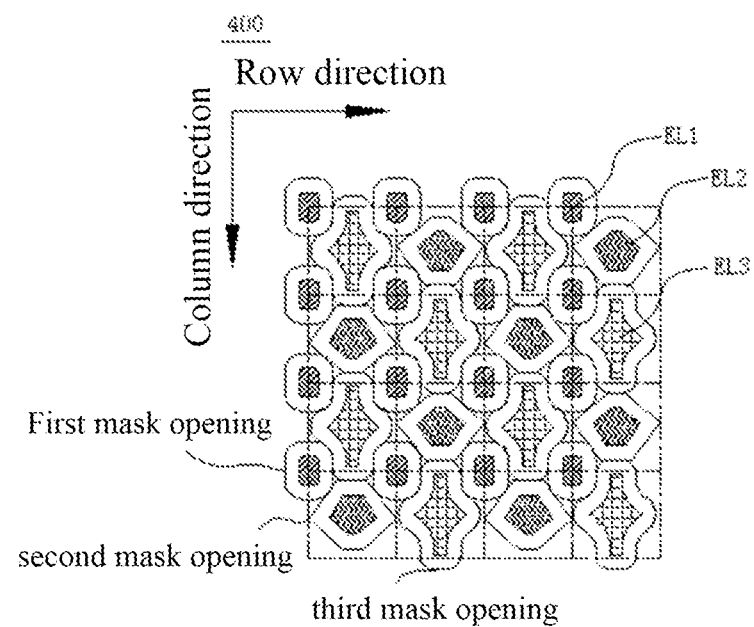
FIG. 12 is a diagram showing still another layout structure of effective light-emitting regions and opening distribution on masks according to some embodiments of the present disclosure.

In some embodiments, referring to FIGS. 8, 11 and 12, the first effective light-emitting region EL1 in the layout structures 200, 300 or 400 of effective light-emitting regions is a rectangle with rounded corners, and in each layout structure 200, 300 or 400 of effective light-emitting regions, the long sides of the first effective light-emitting regions EL1 of the same column are located in the same straight line or parallel to each other.

Figure 13:
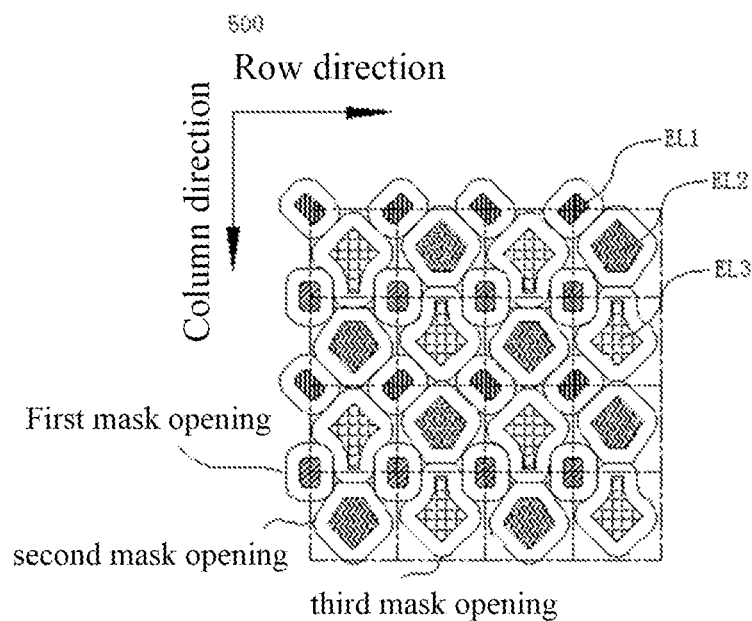
FIG. 13 is a diagram showing still another layout structure of effective light-emitting regions and opening distribution on masks according to some embodiments of the present disclosure.

In some embodiments, the long sides of at least two first effective light-emitting regions EL1 in the same column are not parallel to each other, so that their extension lines intersect with each other. For example, as shown in FIG. 13, the first effective light-emitting region EL1 in the layout structure 500 of effective light-emitting regions is a rectangle with rounded corners. In two adjacent first effective light-emitting regions EL1 in the same column, the two long sides of one first effective light-emitting region EL1 are parallel to the column direction, while the two long sides of the other first effective light-emitting region EL1 are at an acute angle of 45° with respect to the column direction. Therefore, the extension lines of the long sides of the two adjacent first effective light-emitting regions EL1 in the same column must intersect with each other.

In some embodiments, at least one first effective light-emitting region EL1 rotates relative to a position where its long side is perpendicular to the row direction. The extension line of the long side of the rotated first effective light-emitting region EL1 has an acute angle or obtuse angle with the row direction, and in the edges of a second effective light-emitting region EL2 adjacent to the rotated first effective light-emitting region EL1, a portion of the second effective light-emitting region EL2 close to the rotated first effective light-emitting region EL1 is parallel to an edge of the rotated first effective light-emitting region EL1. For example, referring to FIGS. 5 and 13, in the layout structure 500 of effective light-emitting regions shown in FIG. 13, a first effective light-emitting region EL1 whose extension line of the long side intersects with the row direction is the rotated first effective light-emitting region EL1, and the angle between the extension line of the long side of the rotated first effective light-emitting region EL1 and the row direction is 45° or 135°. In a second effective light-emitting region EL2 adjacent to the rotated first effective light-emitting region EL1, the edges of the second effective light-emitting region EL2 closest to the long side of the rotated first effective light-emitting region EL1 are a straight edge f and a straight edge g, which join at the top of the second effective light-emitting region EL2 to form a top angle. With the change of the rotation angle of the first effective light-emitting region EL1, the top angle of the adjacent second effective light-emitting region EL2 can be changed so that its straight edges f and straight edge g can be parallel to the long side of the rotated first effective light-emitting region EL1, so as to realize effective utilization of the layout space of the effective light-emitting regions.

Similarly, in some embodiments, among the edges of the third effective light-emitting region EL3 adjacent to the rotated first effective light-emitting region EL1, a portion close to the rotated first effective light-emitting region EL1 is parallel to an edge of the rotated first effective light-emitting region EL1.

In some embodiments, in the same first row of effective light-emitting region Rw1, each two adjacent first effective light-emitting regions EL1 are arranged axial-symmetrically, and the axis of symmetry is parallel to the column direction. For example, referring to FIG. 13, in a rotated first effective light-emitting region, the extension line of the long side of one of the two adjacent first effective light-emitting regions EL1 forms an angle of 45° with the row direction, and the extension line of the long side of the other first effective light-emitting region EL1 forms an angle of 135° with the row direction. Therefore, they are axial symmetric about the axis of symmetry positioned therebetween and parallel to the column direction. Due to the axial symmetry, the minimum distance in the row direction between two adjacent first effective light-emitting regions EL1 of the rotated first effective light-emitting regions is smaller than that in a row without rotation. Therefore, for rotated first effective light-emitting regions, a vertex angle of a second effective light-emitting region EL2 or a third effective light-emitting region EL3 can be accommodated between two adjacent rotated first effective light-emitting regions EL1; for non-rotated first effective light-emitting regions, an edge of a second effective light-emitting region EL2 or a third effective light-emitting region EL3 can be accommodated between two adjacent first effective light-emitting regions EL1.

Figure 14:
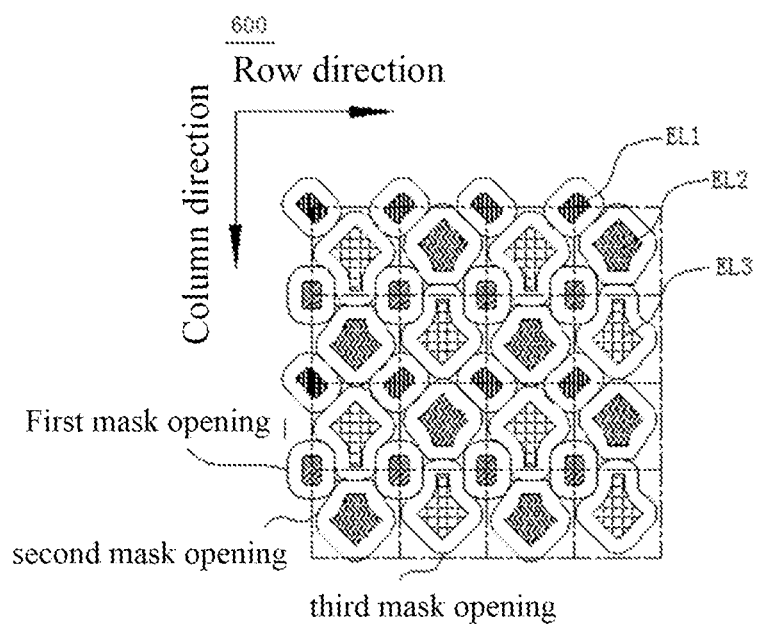
FIG. 14 is a diagram showing still another layout structure of effective light-emitting regions and opening distribution on masks according to some embodiments of the present disclosure.

In some embodiments, the shape of the second effective light-emitting region EL2 is different from that of the third effective light-emitting region EL3. For example, in the arrangement structure 600 of effective light-emitting regions shown in FIG. 14, a second effective light-emitting region EL2 is a pattern with two first curved edges and three straight edges, and a third effective light-emitting region EL3 is a pattern with two second curved edges and three straight edges. The curvature of the first curved edge differs from that of the second curved edge. Although the edges of the second effective light-emitting region EL2 and the edges of the third effective light-emitting region include the same number of straight edges and curved edges, and they both are axial symmetric patterns (the axis of symmetry is parallel to the column direction), they have different shapes. As another example, in the arrangement structure 700 of effective light-emitting regions shown in FIG. 15, the second effective light-emitting region EL2 is a diamond with rounded corners (e.g., a square with rounded corners), and the third effective light-emitting region EL3 is a pattern with two second curved edges and three straight edges. That is, they are different in shape.

FIG. 16 shows a flowchart of a method of manufacturing a display panel according to some embodiments of the present disclosure. As shown in FIG. 16, the method for manufacturing the display panel according to the present disclosure includes the following steps:

step 1601: forming a plurality of first effective light-emitting regions in the row direction, wherein the plurality of first effective light-emitting regions form a plurality of first rows of effective light-emitting regions; and step 1602: in a row direction, forming a plurality of second effective light-emitting regions and a plurality of third effective light-emitting regions, wherein the plurality of second effective light-emitting regions and the plurality of third effective light-emitting regions are alternately arranged to form a plurality of second rows of effective light-emitting regions;

wherein, the first rows of effective light-emitting regions and the second rows of effective light-emitting regions are alternately arranged in a column direction perpendicular to the row direction, and a virtual quadrilateral is formed by lines connecting geometric center of gravities of four first effective light-emitting regions in two adjacent rows and two adjacent columns;

the geometric center of gravity of the second effective light-emitting region and the geometric center of gravity of the third effective light-emitting region are located in corresponding virtual quadrilaterals respectively;

the second effective light-emitting region comprises at least one first curved edge, and/or the third effective light-emitting region comprises at least one second curved edge.

It shall be noted that: the above embodiments are merely illustration of the technical solution of this disclosure, but are not limitation thereof. Although this disclosure has been described in detail with reference to the above embodiment, those ordinary skilled in the art shall understand: the technical solutions recited in the various embodiments described above may be modified or some technical features thereof may be substituted equivalently, such modifications or substitutions do not deviate the nature of the technique from the spirit and scope of the technique embodied in the embodiments according to this disclosure.

The invention claimed is:

1. A display panel, comprising:
a plurality of first sub-pixels, a plurality of second sub-pixels and a plurality of third sub-pixels; wherein the first sub-pixel comprises a first light-emitting device which comprises a first effective light-emitting region; the second sub-pixel comprises a second light-emitting device which comprises a second effective light-emitting region; and the third sub-pixel comprises a third light-emitting device which comprises a third effective light-emitting region;
in a row direction, the plurality of first effective light-emitting regions form a plurality of first rows of effective light-emitting regions, and the plurality of second effective light-emitting regions and the plurality of third effective light-emitting regions are alternately arranged to form a plurality of second rows of effective light-emitting regions; the first rows of effective light-emitting regions and the second rows of effective light-emitting regions are alternately arranged in a column direction perpendicular to the row direction; a virtual quadrilateral is formed by lines connecting geometric centers of gravity of four first effective light-emitting regions in two adjacent rows and two adjacent columns;
a geometric center of gravity of the second effective light-emitting region and a geometric center of gravity of the third effective light-emitting region are located in corresponding virtual quadrilaterals respectively;
the second effective light-emitting region comprises at least one first curved edge, and/or the third effective light-emitting region comprises at least one second curved edge;
wherein a shape of the first effective light-emitting region is a rectangle or a rectangle with rounded corners; and
wherein long sides of the first effective light-emitting regions in a same column are located on a same straight line or parallel to each other.

2. The display panel according to claim 1, wherein the first effective light-emitting region comprises a first portion adjacent to the first curved edge, the first portion being in a shape corresponding to a shape of the first curved edge;
and/or
the first effective light-emitting region comprises a second portion adjacent to the second curved edge, the second portion being in a shape corresponding to a shape of the second curved edge.

3. The display panel according to claim 2, wherein the first curved edge is a concave curved edge, and the first portion has a convex shape;
and/or
the second curved edge is a concave curved edge, and the second portion has a convex shape.

4. The display panel according to claim 1, wherein a portion of the second effective light-emitting region is located between two adjacent first effective light-emitting regions;
and/or
a portion of the third effective light-emitting region is located between two adjacent first effective light-emitting regions.

5. The display panel according to claim 4, wherein the second effective light-emitting region comprises at least two first curved edges and a first straight edge, wherein the two first curved edges are connected with both ends of the first straight edge, and the first straight edge is located between two adjacent first effective light-emitting regions along the row direction or the column direction;

and/or the third effective light-emitting region comprises at least two second curved edges and a second straight edge, wherein the two second curved edges are connected with both ends of the second straight edge, and the second straight edge is located between two adjacent first effective light-emitting regions along the row direction or the column direction.

6. The display panel according to claim 1, wherein a distance between a first geometric center of gravity and a second geometric center of gravity is not equal to a distance between the first geometric center of gravity and a third geometric center of gravity;

wherein the first geometric center of gravity is the geometric center of gravity of the first effective light-emitting region, the second geometric center of gravity is the geometric center of gravity of the second effective light-emitting region adjacent to the first effective light-emitting region, and the third geometric center of gravity is the geometric center of gravity of the third effective light-emitting region adjacent to the first effective light-emitting region.

7. The display panel according to claim 1, wherein the second effective light-emitting region has an even number of first curved edges and is an axial symmetric pattern;

and/or the third effective light-emitting region has an even number of second curved edges and is an axial symmetric pattern.

8. The display panel according to claim 1, wherein in two adjacent second rows of effective light-emitting regions, each second effective light-emitting region has the same shape and size;

and/or in two adjacent second rows of effective light-emitting regions, each third effective light-emitting region has the same shape and size.

9. The display panel according to claim 8, wherein two second effective light-emitting regions located in different rows and closest to each other are centrosymmetric about a first point, wherein the first point is the geometric center of gravity of the first effective light-emitting region through which a connecting line of geometric centers of gravity of the two second effective light-emitting regions passes;

and/or two third effective light-emitting regions located in different rows and closest to each other are centrosymmetric about a second point, wherein the second point is the geometric center of gravity of the first effective light-emitting region through which a connecting line of geometric centers of gravity of the two third effective light-emitting regions passes.

10. The display panel according to claim 8, wherein in two adjacent second rows of effective light-emitting regions, a shape of the second effective light-emitting region located in one row is a mirror image of a shape of the second effective light-emitting region located in the other row along a mirror axis parallel to the row direction; and/or in two adjacent second rows of effective light-emitting regions, a shape of the third effective light-emitting region located in one row is a mirror image of a shape of the third effective light-emitting region located in the other row along a mirror axis that is parallel to the row direction.

11. The display panel according to claim 1, wherein long sides of at least two first effective light-emitting regions in the same column are not parallel to each other.

12. The display panel according to claim 1, wherein in the same first row of effective light-emitting regions, two adjacent first effective light-emitting regions are axial symmetric, with an axis of symmetry parallel to the column direction.

13. The display panel according to claim 1, wherein the shape of the second effective light-emitting region is different from that of the third effective light-emitting region.

14. A display device, comprising: the display panel according to claim 1.

15. A method for manufacturing a display panel, comprising:

in a row direction, forming a plurality of first effective light-emitting regions that form a plurality of first rows of effective light-emitting regions, in the row direction, forming a plurality of second effective light-emitting regions and a plurality of third effective light-emitting regions, wherein the plurality of second effective light-emitting regions and the plurality of third effective light-emitting regions are alternately arranged to form a plurality of second rows of effective light-emitting regions;

wherein, the first rows of effective light-emitting regions and the second rows of effective light-emitting regions are alternately arranged in a column direction perpendicular to the row direction, and a virtual quadrilateral is formed by lines connecting geometric centers of gravity of four first effective light-emitting regions in two adjacent rows and two adjacent columns;

a geometric center of gravity of the second effective light-emitting region and a geometric center of gravity of the third effective light-emitting region are located in corresponding virtual quadrilaterals respectively;

the second effective light-emitting region comprises at least one first curved edge, and/or the third effective light-emitting region comprises at least one second curved edge;

wherein a shape of the first effective light-emitting region is a rectangle or a rectangle with rounded corners; and wherein long sides of the first effective light-emitting regions in same column are located on a same straight line or parallel to each other.

\* \* \* \* \*